US007232610B2

(12) United States Patent
Katsuki et al.

(10) Patent No.: US 7,232,610 B2
(45) Date of Patent: Jun. 19, 2007

(54) PROCESS FOR PREPARING METAL-COATED AROMATIC POLYIMIDE FILM

(75) Inventors: Shozo Katsuki, Yamaguchi (JP); Hidenori Mii, Yamaguchi (JP)

(73) Assignee: UBE Industries, Ltd., Yamaguchi (JP)

( * ) Notice: Subject to any disclaimer, the term of this patent is extended or adjusted under 35 U.S.C. 154(b) by 0 days.

(21) Appl. No.: 11/033,070

(22) Filed: Jan. 10, 2005

(65) Prior Publication Data
US 2005/0118438 A1  Jun. 2, 2005

Related U.S. Application Data

(63) Continuation of application No. 10/194,618, filed on Jul. 11, 2002, now abandoned, which is a continuation-in-part of application No. 10/093,998, filed on Mar. 7, 2002, now abandoned.

(30) Foreign Application Priority Data
Jun. 4, 2001   (JP)   ............................ 2001-168194

(51) Int. Cl.
*B32B 15/08* (2006.01)
*B32B 27/06* (2006.01)

(52) U.S. Cl. .................................. 428/458; 428/473.5
(58) Field of Classification Search ...................... None
See application file for complete search history.

(56) References Cited

U.S. PATENT DOCUMENTS 5,262,227 A * 11/1993 Takabayashi et al. ........ 428/215
6,596,968 B2 * 7/2003 Yamamoto et al. .... 219/121.71

FOREIGN PATENT DOCUMENTS

JP          01321687 A   * 12/1989

* cited by examiner

*Primary Examiner*—Monique R. Jackson
(74) *Attorney, Agent, or Firm*—Reed Smith LLP

(57) ABSTRACT

A metal-coated aromatic polyimide film having high peel strength between the polyimide film and the metal coat can be advantageously prepared by the steps of treating an aromatic polyimide film composed of a polyimide substrate layer of aromatic polyimide having biphenyltetracarboxylic acid units in its molecular structure coated with a polyimide surface layer of aromatic polyimide having bendable bondings in its molecular structure, with electric discharge under reduced pressure, to produce protrusions connected with each other in the form of network of chain on the surface layer, and placing plural metal films on the surface layer having the protrusions.

11 Claims, 2 Drawing Sheets

PROCESS FOR PREPARING METAL-COATED AROMATIC POLYIMIDE FILM

CROSS-REFERENCE TO RELATED APPLICATION

This application is a continuation of U.S. application Ser. No. 10/194,618 filed Jul. 11, 2002 now abandoned, which is a continuation-in-part application of U.S. application Ser. No. 10/093,998 filed Mar. 7, 2002, which is now abandoned, the complete disclosures of which are hereby incorporated by reference.

This application claims priority of Japanese Application No. 2001-168194 filed Jun. 4, 2001, the entire disclosure of which is hereby incorporated by reference.

FIELD OF THE INVENTION

This invention relates to a process for preparing a metal-coated aromatic polyimide film, which is favorably employable for manufacturing particularly a flexible printed circuit board, TAB tape, or a multilayer circuit board.

BACKGROUND OF THE INVENTION

Aromatic polyimide films show high heat resistance, good chemical resistance, high electrical insulating property and high mechanical strength, and therefore are widely used in various technical fields. For instance, an aromatic polyimide film is favorably employed in the form of a metal-coated continuous film for manufacturing a flexible printed circuit board (FPC), a carrier tape for tape-automated-bonding (TAB), and a tape of lead-on-chip (LOC) structure.

Previously, the metal-coated aromatic polyimide film has been produced generally by bonding an aromatic polyimide film to a metal foil using a conventional adhesive such as epoxy resin. However, due to low heat-resistance of the conventional adhesive, the produced metal-coated aromatic polyimide film cannot show satisfactory high heat-resistance. It is difficult particularly for an aromatic polyimide film containing biphenyltetracarboxylic acid units, for instance, UPILEX-S (available from Ube Industries, Ltd.) which comprises biphenyltetracarboxylic acid units and phenylenediamine units, to fix directly a metal foil onto the film due to poor affinity of the surface of the polyimide film. Moreover, the metal foil is not appropriately employable for producing a metal-coated aromatic polyimide film having a thin metal coat which is strongly demanded at present. The thin metal coat is favorably employable for producing a circuit of a fine etched pattern.

In consideration of the above-mentioned problem and present demand, it has been proposed to manufacture a metal-coated aromatic polyimide film by forming a thin copper metal film on an aromatic polyimide film by means of electro-plating. However, it is difficult to produce an aromatic polyimide film having a well fixed metal film due to the poor affinity of the polyimide film.

It has been known that a surface of an aromatic polyimide film can be improved on its affinity to metal plating or deposition, by processing the film surface with an alkaline solution. However, the wet processing is not industrially preferred because it is required to sufficiently wash the alkaline-processed surface with pure water. Surface plasma treatment and corona discharge treatment are also known to improve the affinity of the polyimide film. However, such treatments are not satisfactory to produce a metal-coated polyimide film having high separation resistance between the metal film and the polyimide film.

Japanese Patent Provisional Publications No. 6-124978 and No. 6-210794 describe to coat a layer of PMDA polyimide which is produced from a combination of pyromellitic dianhydride and 4,4'-diaminodiphenyl ether over such an aromatic polyimide film as UPILEX-S and then depositing or plating a metal such as copper on the PMDA polyimide layer. Thus produced metal-coated aromatic polyimide film, however, has a problem in that the PMDA polyimide layer is not fixed onto the UPILEX-S with satisfactory bonding strength.

Japanese Patent Provisional Publication No. 1-321687 describes a process for preparing a flexible printable circuit board to process a PMDA polyimide film (such as a commercially available KAPTON) with glow-discharge plasma to increase the surface tension of the film to 54 dyne/cm or higher, depositing a metal layer on the processed surface of the film under vacuum, and forming a thick copper film on the metal-deposited layer by plating. According to the working example, however, the initial peeling strength of the produced metal-coated polyimide film is in the range of 0.5 to 0.8 Kgf/cm which is not satisfactorily high. The present inventors have found that a metal-coated polyimide film which is produced from an aromatic polyimide film containing 3,3',4,4'-biphenyltetracarboxylic acid units (e.g., UPILEX-S) in place of the PMDA polyimide film by the above-mentioned process shows an initial peeling strength of less than 0.5 Kgf/cm.

SUMMARY OF THE INVENTION

It is an object of the invention to provide a metal-coated aromatic polyimide film containing biphenyltetracarboxylic acid units which shows a high initial peeling strength.

It is an another object of the invention to provide a metal-coated aromatic polyimide film containing biphenyltetracarboxylic acid units that has a thin polyimide coat film and shows a high initial peeling strength.

The present invention resides in a process for preparing a metal-coated aromatic polyimide film which comprises the steps of:

treating an aromatic polyimide film which comprises a polyimide substrate layer comprising aromatic polyimide having biphenyltetracarboxylic acid units in a molecular structure thereof coated with a polyimide surface layer comprising aromatic polyimide having bendable bondings in a molecular structure thereof, with electric discharge under reduced pressure, to produce protrusions connected with each other in the form of network of chain on the surface layer, and placing two or more metal films on the surface layer having the protrusions.

The invention also resides in a process for preparing a metal-coated aromatic polyimide film which comprises the steps of:

treating an aromatic polyimide film which comprises a polyimide substrate layer comprising aromatic polyimide having biphenyltetracarboxylic acid units in a molecular structure thereof coated on both surfaces thereof with a polyimide surface layer comprising aromatic polyimide having bendable bondings in a molecular structure thereof, with electric discharge under reduced pressure, to produce protrusions connected with each other in the form of network of chain on the surface layer, and placing two or more metal films on both surface layers having the protrusions.

The invention further resides in a process for preparing a surface-activated aromatic polyimide film which comprises treating an aromatic polyimide film which comprises a polyimide substrate layer comprising aromatic polyimide having biphenyltetracarboxylic acid units in a molecular structure thereof and a polyimide surface layer comprising aromatic polyimide having bendable bondings in a molecular structure thereof, with electric discharge under reduced pressure, to produce protrusions connected with each other in the form of network of chain on the surface layer.

The invention furthermore resides in a metal-coated aromatic polyimide film comprising a polyimide substrate layer, a polyimide surface layer and plural metal films coated on the surface layer in which the polyimide substrate layer comprises aromatic polyimide having biphenyltetracarboxylic acid units in a molecular structure thereof and the polyimide surface layer comprises aromatic polyimide having bendable bondings in a molecular structure thereof, the surface layer having protrusions connected with each other in the form of network of chain on a surface thereof.

The invention furthermore resides in a surface-activated aromatic polyimide film comprising a polyimide substrate layer and a polyimide surface layer in which the polyimide substrate layer comprises aromatic polyimide having biphenyltetracarboxylic acid units in a molecular structure thereof and the polyimide surface layer comprises aromatic polyimide having bendable bondings in a molecular structure thereof, the surface layer having protrusions connected with each other in the form of network of chain on a surface thereof.

In the present invention, the protrusions preferably have an average height of 0.03 to 0.1 μm in terms of Ra.

The substrate layer and the surface layer are preferably combined to give the polyimide film under the condition that the surface layer is not separatable from the substrate film without breakage. The aromatic polyimide of the substrate layer is preferably produced from a combination of an aromatic tetracarboxylic acid compound comprising at least 10 mol. % of 3,3',4,4'-biphenyltetracarboxylic dianhydride and an aromatic diamine compound comprising at least 5 mol. % of p-phenylenediamine. The metal films preferably comprises plural metal-deposited layers and a metal plated layer formed on the metal-deposited layers. The surface polyimide layer preferably has a tensile modulus of 200 to 700 kg/mm$^2$ (MD, according to ASTM-D882).

It is preferred that the aromatic polyimide film has through-holes and the metal films are placed on walls of the through-holes when the metal films are placed on the surface layer having the protrusions. Otherwise, metal can be plated on the walls of the through-holes, after a catalyst metal is placed on the through-hole walls. The surface layer on which the protrusions are produced is preferably treated with plasma cleaning before the metal films are placed thereon.

In the metal-coated aromatic polyimide film of the invention, the metal films are preferably bonded to the polyimide surface layer with a peeling strength (90° peeling strength) of 1 kgf/cm or more, preferably 1 to 5 Kgf/cm. The metal-coated aromatic polyimide film of the invention preferably shows a peeling strength (90° peeling strength) of 0.8 Kgf/cm or more, preferably 0.8 to 5 Kgf/cm, after heated for 24 hours to 200° C. in a nitrogen gas atmosphere). It is also preferred that the metal-coated aromatic polyimide film of the invention preferably shows a peeling strength (90° peeling strength) of 0.5 Kgf/cm or more, preferably 0.6 to 3 Kgf/cm, after heated for 24 hours to 121° C. at a pressure of 2 atm., 100% RH (namely, PCT).

DETAILED DESCRIPTION OF THE INVENTION

Figure 1:
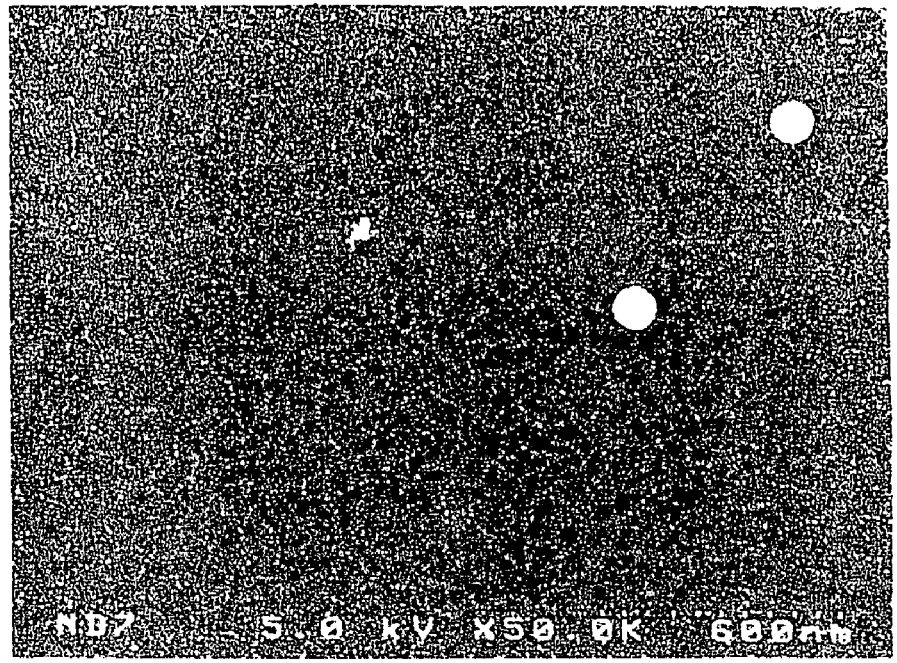
FIG. 1 is a SEM photograph (×50,000) taken on an aromatic polyimide film of the invention in which the protrusions that are produced by plasma processing under reduced pressure are connected with each other in the form of network of chain on the surface layer of the polyimide film.

The metal-coated aromatic polyimide film of the invention is composed of an aromatic polyimide film comprising a polyimide substrate layer and a polyimide surface layer and plural metal films coated on the surface layer. The polyimide substrate layer has the polyimide surface layer on one surface thereof or on both surfaces thereof. The metal films can be coated on one surface layer or both of the surface layer. The polyimide substrate layer comprises aromatic polyimide having biphenyltetracarboxylic acid units in a molecular structure thereof, and the polyimide surface layer comprises aromatic polyimide having bendable bondings in a molecular structure thereof.

The aromatic polyimide film can be preferably prepared by the steps of co-extruding a solution of a precursor of the aromatic polyimide having biphenyltetracarboxylic acid units in a molecular structure and one or two solutions of a precursor of the aromatic polyimide having bendable bondings in a molecular structure thereof to produce a solution film, drying the solution film at 80 to 200° C., and heating the dried film to a temperature of higher than 300° C., preferably a temperature of 300 to 550° C. The precursor solutions preferably have a viscosity of 500 to 5,000 poise.

The aromatic polyimide for the substrate layer comprises biphenyltetracarboxylic acid units and aromatic diamine units. The biphenyltetracarboxylic acid units preferably comprise not less than 10 mol. %, more preferably not less than 15 mol. %, of biphenyltetracarboxylic acid units. The aromatic diamine units preferably comprise not less than 5 mol. %, more preferably not less than 15 mol. % of p-phenylenediamine units. The biphenyltetracarboxylic acid units can contain other biphenyltetracarboxylic acid units such as pyromellitic acid units. The aromatic diamine units contain other aromatic diamine units such as 4,4-diaminodiphenyl ether units.

The precursor solutions can be produced using a polar organic solvent such as an amide solvent (e.g., N,N-dimethylformamide, N,N-dimethylacetamide, N-methyl-2-pyrrolidone, or N-methylcaprolactam), dimethylsulfoxide, hexamethylphosphoramide, dimethylsulfone, tetramethylenesulfone, dimethyltetramethylenesulfone, pyridine, or ethylene glycol.

The aromatic polyimide that has bendable bondings in a molecular structure thereof and is employed for preparing the surface layer is preferably prepared from a combination of an aromatic tetracarboxylic dianhydride (or its reactive derivative) and an aromatic diamine.

The aromatic tetracarboxylic dianhydride preferably has the following formula (1):

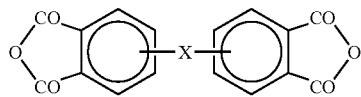

in which X is a divalent group represented by O, CO, S, $SO_2$, $CH_2$, or $C(CH_3)_2$.

The aromatic diamine preferably has the following formula (2):

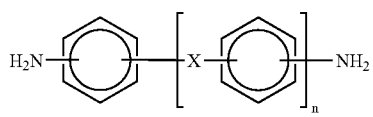

in which X is a divalent group represented by O, CO, S, $SO_2$, $CH_2$, or $C(CH_3)_2$, and n is 0 or an integer of 1 to 4.

The aromatic polyimide employed for preparing the surface layer should have the aromatic tetracarboxylic dianhydride of the formula (1) and/or the aromatic diamine of the formula (2).

The aromatic tetracarboxylic dianhydride of the formula (1) preferably is derived from 3,3',4,4'-benzophenonetetracarboxylic acid, 2,2-bis(3,4-dicarboxyphenyl)propane, bis (3,4-dicarboxyphenyl)methane, bis(3,4-dicarboxyphenyl) ether, bis(3,4-dicarboxyphenyl)thioether, or bis(3,4-dicarboxyphenyl)sulfone. These tetracarboxylic dianhydrides can be employed singly or in combination.

Other aromatic tetracarboxylic dianhydride derived from 3,3',4,4'-biphenyltetracarboxylic acid, 2,3,3',4'-biphenyltetracarboxylic acid, or pyromellitic acid can be employed in combination with the aromatic tetracarboxylic dianhydride of the formula (1), or employed alone when the aromatic diamine of the formula (2) is employed as the aromatic diamine.

The aromatic diamine of the formula (2) preferably is a diphenyl(thio)ether diamine such as 4,4'-diaminodiphenylether, 3,4'-diaminodiphenylether, 3,3'-diaminodiphenylether, or 4,4'-diaminodiphenylthioether, a diaminobenzophenone such as 3,3'-diaminobenzophenone or 4,4'-diaminobenzophenone, a diphenylalkylenediamine such as 3,3'-diaminodiphenylmethane, 3,3'-diaminodiphenylpropane, or 4,4'-diaminodiphenylpropane, a diaminodisulfide such as 3,3'-diaminodiphenyldisulfide or 4,4'-diaminodiphenyldisulfide, diaminodiphenylsulfone such as 3,3'-diaminodiphenylsulfone or 3,4'-diaminodiphenylsulfone, a bis-(aminophenoxy)benzene such as 1,3-bis(3-aminophenoxy) benzene, a bis(aminophenoxy)biphenyl such as 4,4'-bis(3-aminophenoxy)biphenyl, or a bis[(aminophenoxy)phenyl]sulfone such as bis[(4-aminophenoxy)phenyl]sulfone. These aromatic diamines can be employed singly or in combination.

Other aromatic diamines such as a diaminobenzene [e.g., 1,4-diaminobenzene(i.e., p-phenylenediamine), 1,3-diaminobenzene, or 1,2-diaminobenzene], or a benzidine compound (e.g., benzidine or 3,3'-dimethylbenzidine) can be employed in combination with the aromatic diamine of the formula (2), or alone when the aromatic tetracarboxylic dianhydride of the formula (1) is employed as the aromatic tetracarboxylic acid compound.

The aromatic polyimide film generally has a thickness of 7 to 100 μm, preferably a thickness of 7 to 50 μm. The surface polyimide layer preferably has a thickness of 0.1 to 10 μm, more preferably a thickness of 0.2 to 5 μm.

According to the invention, one surface polyimide layer or one or both of the surface polyimide layers should be treated with electric discharge under reduced pressure to etch the surface under the condition that protrusions connected with each other in the form of network of chain are produced on at least a portion of the surface layer(s). A typical protrusion is seen in FIG. 1 of the attached drawings. The electric discharge is preferably performed under reduced pressure, that is, vacuum electric discharge. The vacuum electric discharge is preferably performed in the presence of gas such as He, Ne, Ar, Kr, Xe, $N_2$, $CF_4$, $O_2$, or a mixture of two of these gases. Ar is most preferred to produce the protrusions of the desired state. The pressure generally is in the range of 0.3 to 50 Pa, preferably 6 to 27 Pa. The temperature generally is a surrounding temperature. If desired, the temperature can be adjusted to a temperature in the range of −20° C. to 20° C.

The protrusions preferably have a mean surface roughness (Ra) of 0.03 to 0.1 μm, more preferably 0.04 to 0.8 μm.

On thus etched polyimide surface layer are formed two or more metal films by deposition and/or plating. If desired, the etched polyimide surface layer can be cleaned by plasma cleaning method after it is placed under atmospheric conditions.

The metal films are preferably composed of an underlying vacuum deposited metal film and a deposited copper top film. The metal films are also preferably composed of an underlying vacuum deposited metal film, a deposited copper intermediate film, and a plated metal top film. The plated film can be produced by electric plating or electroless plating. The electroless plating may be advantageous because it can form a metal coverage to cover pin-holes. The vacuum deposition can be performed by the known vacuum depositing or sputtering. The vacuum depositing is preferably performed at a pressure of $10^{-5}$ to 1 Pa and at a deposition rate of 5 to 500 nm/sec. The sputtering is preferably performed by the known DC magnet sputtering, at a pressure of less than 13 Pa, more preferably 0.1 to 1 Pa, and at a deposition rate of 0.05 to 50 nm/sec.

The deposited metal film preferably has a thickness of 10 nm to 1 μm, more preferably 0.1 to 0.5 μm. The plated metal film preferably has a thickness larger than that of the deposited metal film, and generally has a thickness of approx. 1 to 20 μm. The thickness of the plural metal films preferably varies within 5%.

The underlying deposited metal film preferably comprises Cr, Ti, Pd, Zn, Mo, Ni, Co, Zr, and/or Fe. Also preferred are metal alloys composed of two or more metals selected from the group consisting of Cr, Ti, Pd, Zn, Mo, Ni, Co, Zr, and Fe, for instance Ni—Cu alloy and Ni—Cr alloy. The top or intermediate deposited metal film preferably comprises Cu. The plated top metal film preferably comprises Cu, Cu alloy, or Ag. Cu is preferred.

The polyimide film processed by electric discharge can be treated to form through-holes by a mechanical process or a wet process before or after the film is covered with the metal films.

The polyimide film processed by electric discharge can have plural metal films on one side and a ceramic film or metal film on another side.

The invention is further described by the following examples.

In the following examples, the physical and chemical characteristics were determined by the methods described below:

Surface tension: contact angle on the film surface is measured under the condition described in JIS K6766.

Appearance of film surface: observed by taking a SEM photograph (×50,000) for confirming if the protrusions of network in the form of chain are produced.

Surface roughness: the film surface is measured using a contact thickness meter.

Initial peel strength: 90° peel strength of the metal films from the polyimide film which is measured at a rate of 50 mm/min (under the condition described in JIS C6471) on a sample (10 mm width) allowed to stand 24 hours after copper plating.

Heat resistance-1: 90° peel strength measured under the above-mentioned conditions after the film is heated to 150° C. for 24 hours in air.

Heat resistance-2: 90° peel strength measured under the above-mentioned conditions after the film is heated to 200° C. for 24 hours in nitrogen gas.

Heat resistance after PCT: 90° peel strength measured under the above-mentioned conditions after the film is heated to 121° C. for 24 hours at 2 atm., at 100% RH.

Film thickness: The sections of the substrate polyimide layer and surface layer are observed and measured by means of optical microscope.

REFERENCE EXAMPLE 1

(1) Preparation of Dope (i.e., Precursor Solution) for Polyimide Substrate Layer In a 200 L-volume reaction vessel were placed 4,600 weight parts of N,N-dimethylacetamide (DMAc) and 270.35 weight parts (2.5 moles) of p-phenylenediamine (PPD). To the resulting mixture was further added under stirring 735.55 weight parts (2.5 moles) of 3,3',4,4'-biphenyltetracarboxylic dianhydride at room temperature (approx. 30° C.) under a nitrogen gas atmosphere. The resulting mixture was further stirred for 6 hours to give a precursor solution (concentration: 18%) having a rotary solution viscosity of approx. 1,600 poise (at 25° C.).

(2) Preparation of Dope (i.e., Precursor Solution) for Polyimide Surface Layer

In a 200 L-volume reaction vessel were placed 500.6 weight parts of N,N-dimethylacetamide (DMAc) and 270.35 weight parts (2.5 moles) of 4,4'-diaminodiphenyl ether (DADE). To the resulting mixture was further added under stirring 735.55 weight parts (2.5 moles) of 3,3',4,4'-biphenyltetracarboxylic dianhydride at room temperature (approx. 30° C.) under a nitrogen gas atmosphere. The resulting mixture was further stirred for 6 hours to give a precursor solution (concentration: 18%) having a rotary solution viscosity of approx. 1,500 poise (at 25° C.).

EXAMPLE 1

One dope for substrate layer prepared above and two dopes for surface layer prepared above were simultaneously extruded onto a continuous metal belt from a three-layer film-preparing manifold die, and the resulting dope solution films were continuously dried by air (heated to 140° C.), until the solution films solidified to produce a united structure. The united films (self-supporting film, volatile component amount: 36 wt. %) were separated from the metal belt and heated in a heating furnace at gradually increased temperatures of 200° C. to 450° C. In the course of heating, the solvent was evaporated and imidization was performed to produce three layered polyimide films (surface layer/substrate layer/surface layer). Thus produced continuous three layered polyimide film had total thickness of 50 μm, in which thickness of substrate film was 44 μm and thickness of each surface layer was 3 μm.

Thus prepared polyimide film was subjected to the following surface treatments, and then covered with plural metal films.

1) Treatment-1: Etching by vacuum plasma treatment

The polyimide film is placed in a vacuum plasma treating apparatus. The apparatus is evacuated to reach 0.1 Pa (inner pressure) and then charged with Ar gas (Ar=100%). Subsequently, the vacuum plasma treatment is carried out at a pressure of 13.3 Pa and a power of 5 KW (40 KHz) for 2 min.

2) Treatment-2: Cleaning of etched film surface

The etched polyimide film is placed in a sputtering apparatus. The apparatus is evacuated to reach an inner pressure of $2 \times 10^{-4}$ Pa and then charged with Ar gas to reach an inner pressure of 0.67 Pa. Subsequently, the electrode attached to the polyimide film is applied a high frequency electric power of 13.56 MHz at a power of 300 W for one minute.

3) Formation of plural metal films

On the polyimide film having been subjected to Treatment-2 is subsequently deposited 10 nm of Cr thin film and then 300 nm of Cu thin film by DC-sputtering at 150 W under Ar atmosphere (0.67 Pa). Thus metal-deposited polyimide film is taken out into the atmospheric conditions. The metal-deposited polyimide film is then treated in an aqueous acidic copper sulfate solution for electric plating to form a plated cooper film of 20 μm thick. The electric plating is carried out in the order of alkali-degreasing/washing with water/washing with aqueous acid/plating, at an electric current of 1 A/cm$^2$ (5 min.) and then an electric current of 4.5 A/dm$^2$ (20 min.).

The physical properties of the metal-coated polyimide film measured and observed under the aforementioned conditions are set forth in Table 1.

FIG. 1 shows protrusions produced on the polyimide surface layer. The polyimide film had good transparency.

EXAMPLES 2 AND 3

The procedures of Example 1 were repeated except that the treating period of Treatment-1 was changed to one min. (for Example 2) and three min. (for Example 3).

The protrusions similar to those seen in FIG. 1 were produced on the whole area of the polyimide surface layer of Example 2, while the protrusions similar to those seen in FIG. 1 were produced on the polyimide surface layer of Example 3 in a portion (half area or more).

The physical properties of the metal-coated polyimide films measured and observed under the aforementioned conditions are set forth in Table 1. The polyimide films had good transparency.

COMPARISON EXAMPLE 1

The procedures of Example 1 were repeated except that Treatment-1 was omitted.

Figure 2:
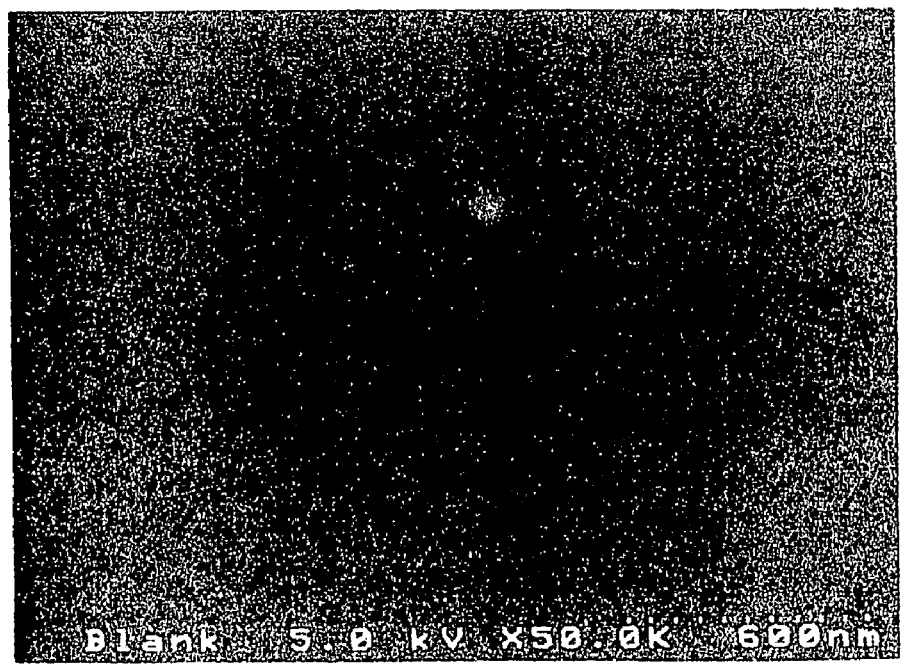
FIG. 2 is a SEM photograph (×50,000) taken on an aromatic polyimide film in which no protrusions are seen on the surface layer of the polyimide film.

FIG. 2 shows the conditions of the surface of the polyimide surface layer.

The physical properties of the metal-coated polyimide film measured and observed under the aforementioned conditions are set forth in Table 1.

COMPARISON EXAMPLE 2

The procedures of Example 1 were repeated except that the treating period of Treatment-1 was changed into five minutes.

Figure 3:
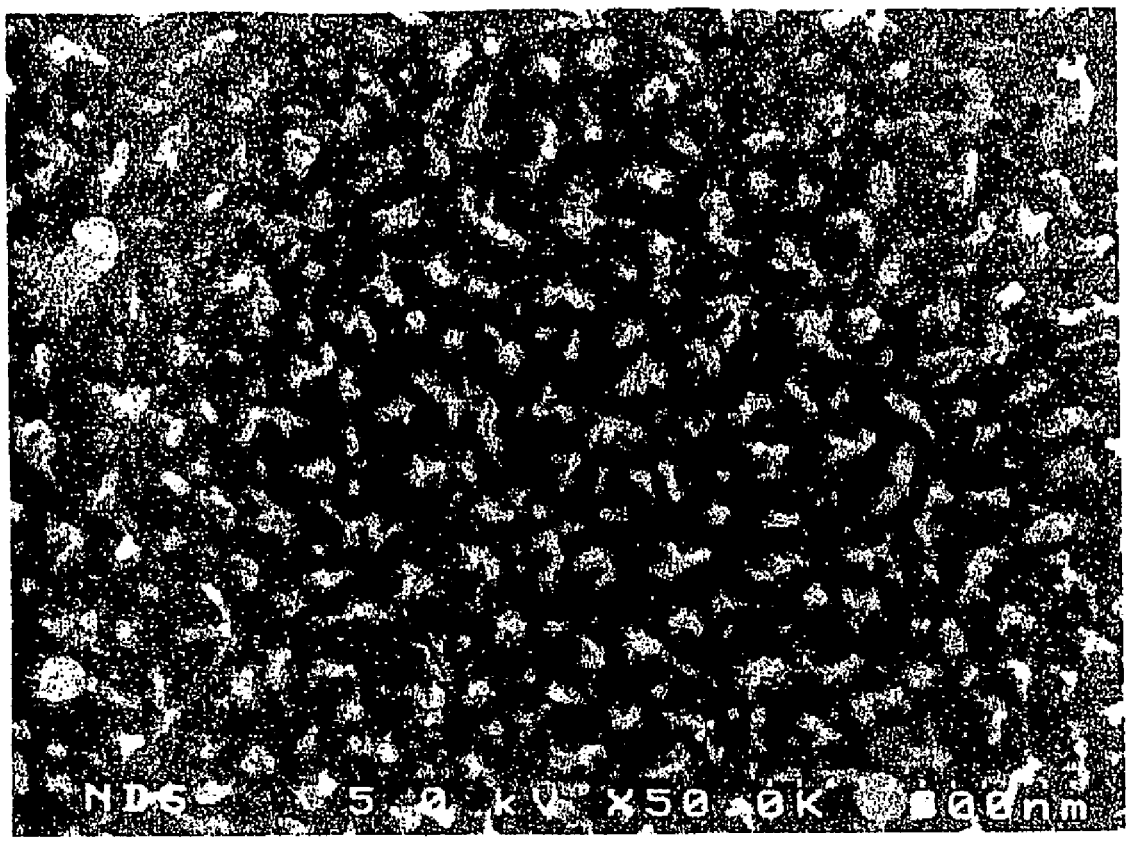
FIG. 3 is a SEM photograph (×50,000) taken on an aromatic polyimide film in which the protrusions produced by excessive plasma processing under reduced pressure are present independent of each other on the surface layer of the polyimide film.

FIG. 3 shows the conditions of the surface of the polyimide surface layer.

The physical properties of the metal-coated polyimide films measured and observed under the aforementioned conditions are set forth in Table 1.

TABLE 1

| Example (period) | Surface tension/ Mean roughness (Ra) | Peel strength (Kgf/cm) | |
|---|---|---|---|
| Com. 1 (0 min) | 42 dyne/cm 0.02 μm | Initial: 150° C., 24 hrs: 200° C., 24 hrs: PCT, 24 hrs: | 1.28 0.75 0.19 1.08 |
| Ex. 2 (1 min) | 56 dyne/cm 0.07 μm | Initial: 150° C., 24 hrs: 200° C., 24 hrs: PCT, 24 hrs: | 1.54 1.02 1.07 1.30 |
| Ex. 1 (2 min) | 56 dyne/cm 0.05 μm | Initial: 150° C., 24 hrs: 200° C., 24 hrs: PCT, 24 hrs: | 1.83 1.15 1.02 1.70 |
| Ex. 3 (3 min) | 53 dyne/cm 0.03 μm | Initial: 150° C., 24 hrs: 200° C., 24 hrs: PCT, 24 hrs: | 1.75 1.24 1.05 0.67 |
| Com. 2 (5 min) | 55 dyne/cm 0.02 μm | Initial: 150° C., 24 hrs: 200° C., 24 hrs: PCT, 24 hrs: | 1.45 1.10 0.85 0.07 |

COMPARISON EXAMPLE 3

The procedures of Example 1 were repeated except that the deposition of underlying Cr film was omitted.

The copper-coated polyimide film had a high initial peel strength of 1.5 Kgf/cm. However, the peel strengths after 150° C. heating, 200° C. heating, and PCT prominently decreased to 0.3 Kgf/cm, 0.1 Kgf/cm, and 0.02 Kgf/cm, respectively.

COMPARISON EXAMPLE 4

The procedures of Example 1 were repeated except that the polyimide film was replaced with a commercially available polyimide film (PMDA film, thickness: 50 μm).

The copper-coated polyimide film had a low initial peel strength of 0.6 Kgf/cm. The peel strengths after 150° C. heating and 200° C. heating prominently decreased to 0.3 Kgf/cm and 0.2 Kgf/cm, respectively. The peel strength after PCT was 0.6 Kgf/cm.

EXAMPLE 4

The copper-deposited polyimide film prepared in Example 1 was successively treated with pre-treatment agents of OPC-50 (40° C., for 2 min.) and OPC-150 (25° C., 5 min.). Both agents were available from Okuno Pharmaceutical Co., Ltd. The polyimide film was then subjected to electroless plating at 60° C., for 10 min., using Copper-LP (available from Okuno Pharmaceutical Co., Ltd), to form a copper film of 0.5 μm thick on the deposited metal layers. On the plated copper layer was furthermore plated electrically a copper plated layer of 10 μm thick, in an aqueous copper sulfate bath.

Thus prepared metal-coated polyimide film had physical properties similar to those measured and observed in Example 1.

EXAMPLES 5 TO 9

The procedures of Example 1 were repeated except that Cr for the underlying deposited metal layer of 10 nm thick was replaced with Ti (Example 5), Pd (Example 6), Mo (Example 7), Ni (Example 8), or Co (Example 9).

Thus prepared metal-coated polyimide films had physical properties similar to those measured and observed in Example 1.

EXAMPLE 10

The procedures of Example 1 were repeated except that through-holes were produced in the polyimide film before the various treatments. Similarly prepared two metal-coated polyimide film having plated through-holes were combined to produce a two layered printable circuit board.

On each of the copper films was formed a circuit pattern in the known manner to give a gold-plated double face-printed circuit board.

EXAMPLES 11 TO 15

The procedures of Examples 5 to 9 were repeated except that through-holes were produced in the polyimide film before the various treatments. Similarly prepared two metal-coated polyimide film having plated through-holes were combined to produce a two layered printable circuit board.

On each of the copper films was formed a circuit pattern in the known manner to give a gold-plated double face-printed circuit board.

EXAMPLE 16

The procedures of Example 1 were repeated except that the plural metal films were formed in the following manner.

On the polyimide film having been subjected to Treatment-2 was deposited 5 nm of thin Ni—Cr alloy film by DC-sputtering at 150 W under Ar atmosphere (0.67 Pa) using a Ni—Cr alloy target (Ni/Cr=80/20 wt ratio). On the Ni—Cr film was then deposited 300 nm of Cu film by DC-sputtering at 150 W under Ar atmosphere (0.67 Pa) using a Cu target. Thus metal-deposited polyimide film was taken out into the atmospheric conditions. The metal-deposited polyimide film was then treated in an aqueous acidic copper sulfate solution for electric plating to form a plated cooper film of 20 μm thick, in the manner described in Example 1.

The protrusions similar to those seen in FIG. 1 were produced on the whole area of the polyimide surface layer of Example 1. The polyimide films had good transparency.

The physical properties of the metal-coated polyimide films are set forth below:
Peel strength
Initial: 1.45 kgf/cm
150° C., 24 hrs: 0.77 kgf/cm
200° C., 24 hrs: 0.77 kgf/cm
PCT, 24 hrs: 0.70 kgf/cm
PCT, 100 hrs: 0.70 kgf/cm

What is claimed is:

1. A surface-activated aromatic polyimide film comprising a polyimide substrate layer and a polyimide surface layer in which the polyimide substrate layer comprises aromatic polyimide comprising biphenyltetracarboxylic acid units and p-phenylenediamine units in a molecular structure thereof and the polyimide surface layer comprises aromatic polyimide comprising biphenyltetracarboxylic acid units and aromatic diamine units of the following formula:

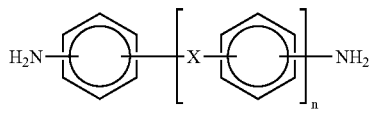

in which X is a divalent group represented by O, CO, S, $SO_2$, $CH_2$ or $C(CH_3)_2$ and n is an integer of 1 to 4, in a molecular structure thereof, the surface layer having protrusions connected with each other in the form of network of chain on a surface thereof.

2. The surface-activated aromatic polyimide film of claim 1 wherein the protrusions have an average height of 0.03 to 0.1 μm in terms of Ra.

3. The metal-coated aromatic polyimide film of claim 1, wherein the biphenyltetracarboxylic acid units in the polyimide substrate layer contain at least 10 mol. % of 3,3',4,4'-biphenyltetracarboxylic acid units.

4. The metal-coated aromatic polyimide film of claim 1, wherein the aromatic polyimide film has a thickness in the range of 7 to 100 μm and the polyimide surface layer has a thickness in the range of 0.1 to 10 μm.

5. A metal-coated aromatic polyimide film comprising a polyimide substrate layer, a polyimide surface layer and plural metal films coated on the surface layer in which the polyimide substrate layer comprises aromatic polyimide comprising biphenyltetracarboxylic acid units and p-phenylenediamine units in a molecular structure thereof and the polyimide surface layer comprises aromatic polyimide comprising biphenyltetracarboxylic acid units and aromatic diamine units of the following formula:

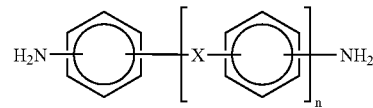

in which X is a divalent group represented by O, GO, S, $SO_2$, $CH_2$ or $C(CH_3)_2$ and n is an integer of 1 to 4, in a molecular structure thereof, the surface layer having protrusions connected with each other in the form of network of chain on a surface thereof, and wherein the plural metal films comprise an underlying metal film selected from the group consisting of Cr, Ti, Pd, Zn, Mo, Ni, Co, Zr, Fe, and combinations thereof, and an upper metal film comprising Cu.

6. The metal-coated aromatic polyimide film of claim 5, wherein the protrusions have an average height of 0.03 to 0.1 μm in terms of Ra.

7. The metal-coated aromatic polyimide film of claim 5, wherein the metal films are bonded to the polyimide surface layer with a peeling strength of 1 kgf/cm or more.

8. The metal-coated aromatic polyimide film of claim 5, wherein the biphenyltetracarboxylic acid units in the polyimide substrate layer contain at least 10 mol. % of 3,3',4,4'-biphenyl-tetracarboxylic acid units.

9. The metal-coated aromatic polyimide film of claim 5, wherein the aromatic polyimide film has a thickness in the range of 7 to 100 μm and the polyimide surface layer has a thickness in the range of 0.1 to 10 μm.

10. The metal-coated aromatic polyimide film of claim 5, wherein the plural metal films contains a metal film attached to the surface layer which comprises at least one metal element selected from the group consisting of Cr, Ti, Pd, Zn, Mo, Ni, Co, Zr, and Fe.

11. The metal-coated aromatic polyimide film of claim 5, which shows a 90° peeling strength of 0.8 kgf/cm or more after heated at 200°C. for 24 hours in a nitrogen gas atmosphere and 0.5 kgf/cm or more after heated at 121°C. for 24 hours at a pressure of 2 atm., 100% RH.

* * * * *